US012622190B2

(12) United States Patent
Okawa et al.

(10) Patent No.: US 12,622,190 B2
(45) Date of Patent: May 5, 2026

(54) METHOD OF MANUFACTURING SEMICONDUCTOR DEVICE

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Takashi Okawa, Nisshin (JP); Kenta Watanabe, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 368 days.

(21) Appl. No.: 18/362,004

(22) Filed: Jul. 31, 2023

(65) Prior Publication Data

US 2024/0047213 A1     Feb. 8, 2024

(30) Foreign Application Priority Data

Aug. 2, 2022     (JP) ................................. 2022-123354

(51) Int. Cl.
*H01L 21/265* (2006.01)
*H01L 21/324* (2006.01)
(Continued)

(52) U.S. Cl.
CPC ....... *H10P 30/206* (2026.01); *H10D 30/0291* (2025.01); *H10P 30/212* (2026.01); *H10P 95/904* (2026.01)

(58) Field of Classification Search
CPC .......................................... H01L 21/322–3228
See application file for complete search history.

(56) References Cited

U.S. PATENT DOCUMENTS

2017/0372905 A1     12/2017     Takashima et al.
2018/0257380 A1      9/2018     Danzuka et al.
2021/0043737 A1*     2/2021     Takashima ........... H10D 62/157

FOREIGN PATENT DOCUMENTS

JP     2002-176004 A     6/2002
JP     2003-124515 A     4/2003
(Continued)

*Primary Examiner* — Christine S. Kim
*Assistant Examiner* — Cole Leon Lindsey
(74) *Attorney, Agent, or Firm* — Posz Law Group, PLC

(57)     ABSTRACT

A method of manufacturing a semiconductor device includes: injecting an inert element or an electron beam into a GaN-based semiconductor substrate; implanting magnesium into the GaN-based semiconductor substrate; and performing a heat treatment after the injecting and the implanting. A first implantation range of inert element or electron beam and a second implantation range of magnesium overlap with each other. A reference depth Dref (nm) calculated using a formula of $Dref=D1+140$ and a deepest injection depth D1 (nm) in the injecting is deeper than a deepest implantation depth D2 (nm) in the implanting. After the heat treatment, a concentration of magnesium decreases toward a deeper side at a predetermined decrease rate at a position of the reference depth Dref. The predetermined decrease rate is smaller than a decrease rate at which a concentration of magnesium becomes $1/10$ per depth of 300 nm.

8 Claims, 11 Drawing Sheets

(51) Int. Cl.
H10D 30/01 (2025.01)
H10P 30/20 (2026.01)
H10P 95/90 (2026.01)

(56) References Cited

FOREIGN PATENT DOCUMENTS

| JP | 2004-356257 | A | | 12/2004 |
|----|-------------|---|---|---------|
| JP | 2017-212407 | A | | 11/2017 |
| JP | 2020-025056 | A | | 2/2020 |
| JP | 2020-155468 | A | | 9/2020 |
| JP | 2022060765 | A | * | 4/2022 |

* cited by examiner

METHOD OF MANUFACTURING SEMICONDUCTOR DEVICE

CROSS REFERENCE TO RELATED APPLICATION

This application is based on Japanese Patent Application No. 2022-123354 filed on Aug. 2, 2022, the disclosure of which is incorporated herein by reference.

TECHNICAL FIELD

The present disclosure relates to a method of manufacturing a semiconductordevice.

BACKGROUND

A p-type semiconductor layer is formed in a GaN-based semiconductor substrate. The GaN-based semiconductor substrate is subjected to heat treatment after magnesium is implanted into the GaN-based semiconductor substrate. When the heat treatment is performed, magnesium is activated inside the GaN-based semiconductor substrate.

SUMMARY

A method of manufacturing a semiconductor device includes: injecting an inert element or an electron beam into a GaN-based semiconductor substrate; implanting a magnesium into the GaN-based semiconductor substrate; and performing a heat treatment on the GaN-based semiconductor substrate after the injecting and the implanting. A first implantation range, which is an injection range of an inert element or an electron beam, and a second implantation range, which is an implantation range of a magnesium, overlap with each other on a surface of the GaN-based semiconductor substrate. A reference depth Dref (nm) calculated using a formula of Dref=D1+140 and a deepest injection depth D1 (nm) in the injecting is deeper than a deepest implantation depth D2 (nm) in the implanting. After the heat treatment, a concentration of magnesium decreases toward a deeper side at a predetermined decrease rate at a position of the reference depth Dref in a distribution of magnesium concentration in a depth direction within a range where the first implantation range and the second implantation range overlap with each other. The predetermined decrease rate is smaller than a decrease rate at which a concentration of magnesium becomes $1/10$ per depth of 300 nm.

DESCRIPTION OF EMBODIMENTS

Figure 1:
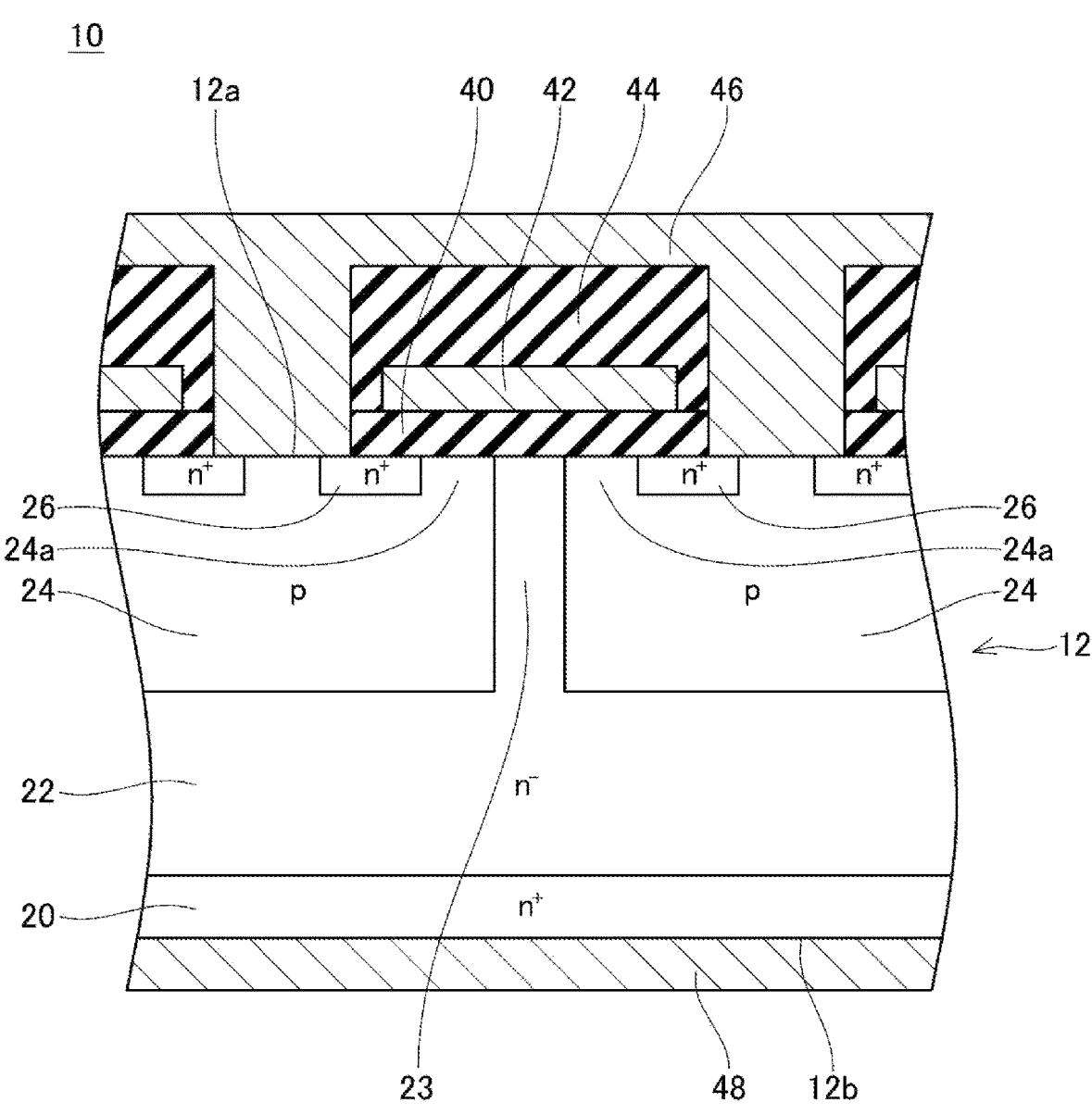
FIG. 1 is a cross-sectional view of a semiconductor device.

There is a technique for forming a p-type semiconductor layer in a GaN-based semiconductor substrate. In this technique, after magnesium is implanted into a GaN-based semiconductor substrate, the GaN-based semiconductor substrate is subjected to heat treatment. When the heat treatment is performed, magnesium is activated inside the GaN-based semiconductor substrate. As a result, a p-type semiconductor layer is formed inside the GaN-based semiconductor substrate.

In the heat treatment for activating magnesium, magnesium diffuses inside the GaN-based semiconductor substrate. Since the diffusion distance of magnesium greatly changes depending on the conditions of the heat treatment, it is difficult to control the diffusion distance of magnesium, such that it is difficult to control the shape of the p-type semiconductor layer. The present disclosure provides a technique for controlling the diffusion distance of magnesium in a GaN-based semiconductor substrate more accurately.

A method of manufacturing a semiconductor device includes: injecting inert element or electron beam into a GaN-based semiconductor substrate; implanting magnesium into the GaN-based semiconductor substrate; and performing a heat treatment on the GaN-based semiconductor substrate after the injecting and the implanting. A first implantation range, which is an injection range of an inert element or an electron beam, and a second implantation range, which is an implantation range of magnesium, overlap with each other on a surface of the GaN-based semiconductor substrate. A reference depth Dref (nm) calculated using a formula of Dref=D1+140 and a deepest injection depth D1 (nm) in the injecting is deeper than a deepest implantation depth D2 (nm) in the implanting. After the heat treatment, a concentration of magnesium decreases toward a deeper side at a predetermined decrease rate at a position of the reference depth Dref in a distribution of magnesium concentration in a depth direction within a range where the first implantation range and the second implantation range overlap with each other. The predetermined decrease rate is smaller than a decrease rate at which a concentration of magnesium becomes $1/10$ per depth of 300 nm.

Either the step of injecting or the step of implanting may be performed first. The GaN-based semiconductor substrate means a semiconductor substrate containing GaN (that is, gallium nitride) as a main component. For example, the GaN-based semiconductor substrate may be made of GaN, AlGaN, InGaN, AlInGaN, or the like. A small decrease rate means that the magnesium concentration decreases at a more rapid rate. In other words, a small decrease rate means that the magnesium concentration decreases with a steeper slope. For example, a decrease rate at which the magnesium concentration becomes $\frac{1}{20}$ per depth of 300 nm is smaller than a decrease rate at which the magnesium concentration becomes $\frac{1}{10}$ per depth of 300 nm. The decrease rate can be expressed by $dD/d\log_{10}P$ when the depth is represented by D (nm), the concentration of magnesium is represented P $(cm^{-3})$, and the logarithmic value of the concentration P with the base being ten is represented by $\log_{10}P$. That is, the decrease rate is a value obtained by differentiating the depth D by the logarithmic value $\log_{10}P$. That is, "the predetermined decrease rate is smaller than a decrease rate at which the magnesium concentration becomes $\frac{1}{10}$ per depth of 300 nm" means that $dD/d\log_{10}P<300$. The inert element means an element that does not function as an acceptor or a donor when injected into the GaN-based semiconductor substrate.

In the step of injecting inert element or electron beam into the GaN-based semiconductor substrate (hereinafter, referred to as a first step), a crystal defect is formed in the injection region. The crystal defect is formed at and around the depth where the inert element or the electron beam is injected. In the GaN-based semiconductor substrate, a crystal defect is formed to a position deeper than the reference depth Dref=D1+140 nm with respect to the deepest injection depth D1 in the first step. At the reference depth Dref, the density of crystal defect rapidly decreases toward the deeper side. In the step of implanting magnesium into the GaN-based semiconductor substrate (hereinafter, referred to as a second step), magnesium is implanted into a range shallower than the reference depth Dref. When the GaN-based semiconductor substrate is subjected to heat treatment after the first step and the second step, magnesium is diffused in the GaN-based semiconductor substrate. At this time, magnesium diffuses rapidly in the region where the crystal defect is formed in the first step (within a region shallower than the reference depth Dref). In contrast, the diffusion of magnesium is suppressed at the interface between the region where the crystal defect is formed and the region where the crystal defect is not formed. Therefore, when magnesium is sufficiently diffused in the region where the crystal defect is formed in the heat treatment step, the end portion of the diffusion region of magnesium can be controlled to be in the vicinity of the position of the reference depth Dref. In this case, a distribution is obtained in which the magnesium concentration decreases toward the deeper side at a very small decrease rate at the position of the reference depth Dref. More specifically, the decrease rate of the magnesium concentration at the position of the reference depth Dref is smaller than the decrease rate at which the magnesium concentration becomes $\frac{1}{10}$ per depth of 300 nm. As described above, according to this manufacturing method, the end portion of the diffusion region of magnesium can be controlled to be in the vicinity of the position of the reference depth Dref, and the variation in the diffusion distance of magnesium can be suppressed.

In the manufacturing method of the present disclosure, in the step of injecting an inert element or an electron beam, at least one of N, Ga, Ar, H, and He may be injected into the GaN-based semiconductor substrate.

In the manufacturing method of the present disclosure, the second implantation range may be included in the first implantation range on the surface. The dose amount DS1 in the injecting, the area S1 of the first implantation range, the dose amount DS2 in the implanting, and the area S2 of the second implantation range may satisfy the relationship of DS1·S1>DS2·S2.

In the manufacturing method of the present disclosure, the heat treatment temperature in the heat treatment may be 1300° C. or higher.

Accordingly, it is possible to more reliably obtain the effect of suppressing the diffusion of Mg by the interface of the injection region in the first injection step.

The manufacturing method of the present disclosure may further include, after the heat treatment, forming a gate electrode such that a range of the surface outside the second implantation range and inside the first implantation range becomes a channel region.

Note that the channel region means a semiconductor region in which an inversion layer (that is, channel) is formed when a potential equal to or higher than a gate threshold is applied to the gate electrode. Accordingly, a region with few crystal defects can be used as a channel region, and channel resistance can be reduced.

In the manufacturing method of the present disclosure, the concentration of magnesium in the channel region may be 10% or more of the concentration of magnesium in the region where magnesium is implanted in the implanting.

The manufacturing method of the present disclosure may further include, after the heat treatment, removing a region where magnesium is implanted in the implanting so as to expose a p-type region below the region, and forming a gate electrode such that the exposed p-type region becomes a channel region.

Accordingly, a region with few crystal defects can be used as a channel region, and channel resistance can be reduced.

FIG. 1 shows a semiconductor device 10 manufactured by a manufacturing method of the present embodiment. The semiconductor device 10 includes a GaN-based semiconductor substrate 12. A drain layer 20, a drift layer 22, plural body layers 24, and plural source layers 26 are provided inside the GaN-based semiconductor substrate 12. The drain layer 20 is an n-type layer and is disposed in a range including the lower surface 12b of the GaN-based semiconductor substrate 12. The drift layer 22 is an n-type layer having an n-type impurity concentration lower than that of the drain layer 20. The drift layer 22 is disposed on the upper side of the drain layer 20. The body layers 24 are p-type layers and are disposed on the upper side of the drift layer 22. Each of the body layers 24 is disposed in a range partially including the upper surface 12a of the GaN-based semiconductor substrate 12. The body layers 24 are spaced apart from each other. Hereinafter, an interval portion between the body layers 24 is referred to as a window portion 23. The drift layer 22 is disposed in the window portion 23. In the window portion 23, the drift layer 22 extends to the upper surface 12a. Each of the source layers 26 is an n-type layer and is disposed inside the corresponding body layer 24. Each of the source layers 26 is disposed in a range partially including the upper surface 12a. Each of the source layers 26 is separated from the drift layer 22 by the corresponding body layer 24.

A gate insulating film 40, a gate electrode 42, an interlayer insulating film 44, and a source electrode 46 are provided on the upper side of the GaN-based semiconductor substrate 12. The gate insulating film 40 extends from the upper surface of one source layer 26 to the upper surface of another source layer 26. The gate insulating film 40 covers the upper surface of the body layer 24 and the upper surface of the drift layer 22 in the window portion 23 between the two source layers 26. The gate electrode 42 is disposed on the upper side of the gate insulating film 40. The gate electrode 42 faces the source layer 26, the body layer 24, and the drift layer 22 in the window portion 23 with the gate insulating film 40 interposed therebetween. The interlayer insulating film 44 covers the gate electrode 42. The source electrode 46 covers the interlayer insulating film 44 and the upper surface 12a of the GaN-based semiconductor substrate 12. The source electrode 46 is electrically connected to each of the source layers 26 and each of the body layers 24.

A drain electrode 48 is provided on the lower side of the GaN-based semiconductor substrate 12. The drain electrode 48 is electrically connected to the drain layer 20.

When the semiconductor device 10 is used, a potential higher than that of the source electrode 46 is applied to the drain electrode 48. When a potential equal to or higher than the gate threshold is applied to the gate electrode 42, a channel is formed in the body layer 24 below the gate insulating film 40 (that is, the surface layer portion of the body layer 24 between the window portion 23 and the source layer 26). Hereinafter, a portion of the body layer 24 where a channel is formed is referred to as a channel region 24a. When a channel is formed in the channel region 24a, electrons flow from the source layer 26 to the drain layer 20 via the channel and the drift layer 22, and the semiconductor device 10 is turned on.

Next, a manufacturing method of the semiconductor device 10 will be described. First, a method of manufacturing a conventional semiconductor device will be described as a comparison example.

Figure 2:
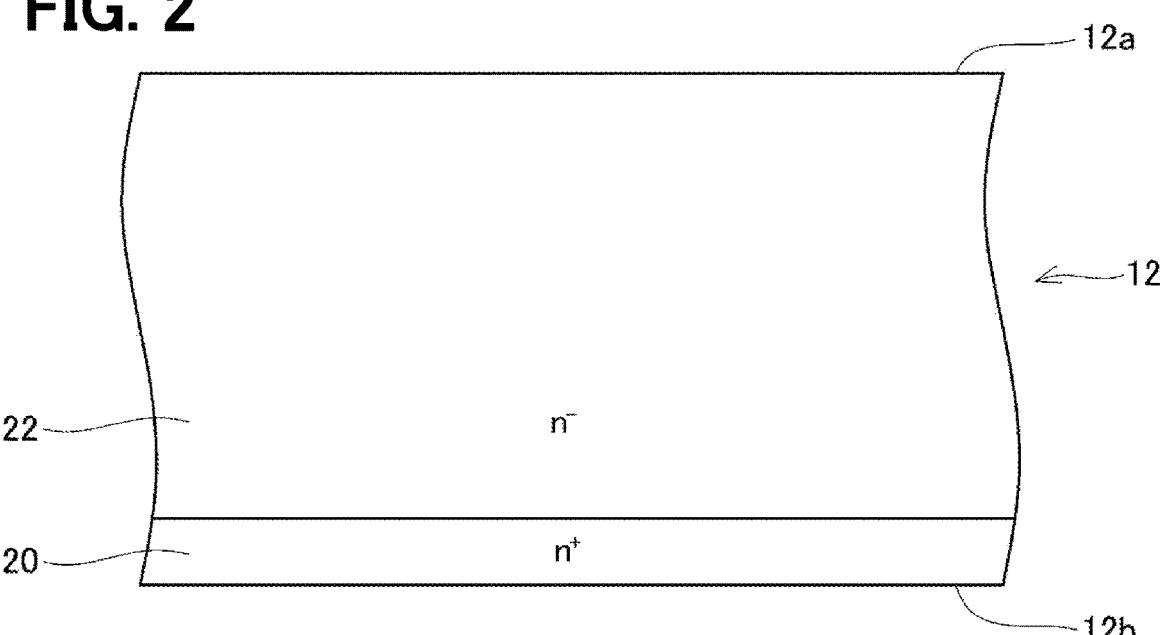
FIG. 2 is an explanatory view illustrating a step of forming a drift layer.

The semiconductor device of the comparison example is manufactured from a GaN-based semiconductor substrate including the drain layer 20. First, as shown in FIG. 2, the drift layer 22 is epitaxially grown on the drain layer 20. Next, Mg (magnesium) is injected into the surface layer portion of the drift layer 22. Next, the GaN-based semiconductor substrate 12 is subjected to a heat treatment to diffuse and activate Mg in the GaN-based semiconductor substrate 12. Since Mg functions as a p-type impurity in the GaN-based semiconductor substrate 12, the p-type body layer 24 is formed in a range where Mg is diffused. Thereafter, as shown in FIG. 1, the source layer 26, the gate insulating film 40, the gate electrode 42, the interlayer insulating film 44, the source electrode 46, and the drain electrode 48 are formed by a conventionally known method. Thus, the semiconductor device of the comparison example is completed.

In the comparison example, it is difficult to control the diffusion distance of Mg in the heat treatment step. This causes the following issues.

As the diffusion distance of Mg becomes longer, the body layer 24 becomes thicker, and the length of the window portion 23 in the vertical direction becomes longer. As the length of the window portion 23 in the vertical direction increases, the resistance of the window portion 23 increases, and the on-resistance of the semiconductor device 10 increases. Therefore, when the variation in the diffusion distance of Mg is large, the variation in the resistance of the window portion 23 increases, and the variation in the on-resistance of the semiconductor device 10 increases.

When the diffusion distance of Mg is long, a small amount of Mg diffused to the lower side of the body layer 24 may segregate at the interface between the drift layer 22 and the drain layer 20. When the segregation layer of Mg is formed at the interface between the drift layer 22 and the drain layer 20, the on-resistance of the semiconductor device 10 increases. Therefore, when the variation in the diffusion distance of Mg is large, the variation in the on-resistance of the semiconductor device 10 increases due to the influence of the segregation layer.

The longer the diffusion distance of Mg is, the lower the p-type impurity concentration in the surface layer portion of the body layer 24 is, and the lower the p-type impurity concentration in the channel region 24a is. When the p-type impurity concentration of the channel region 24a is low, the gate threshold (that is, a gate potential necessary for forming a channel) becomes low. Therefore, when the variation in the diffusion distance of Mg is large, the variation in the gate threshold increases.

As described above, in the comparison example, it is difficult to control the diffusion distance of Mg, and as a result, variations in the on-resistance and the gate threshold of the semiconductor device 10 increase.

First Embodiment

Figure 3:
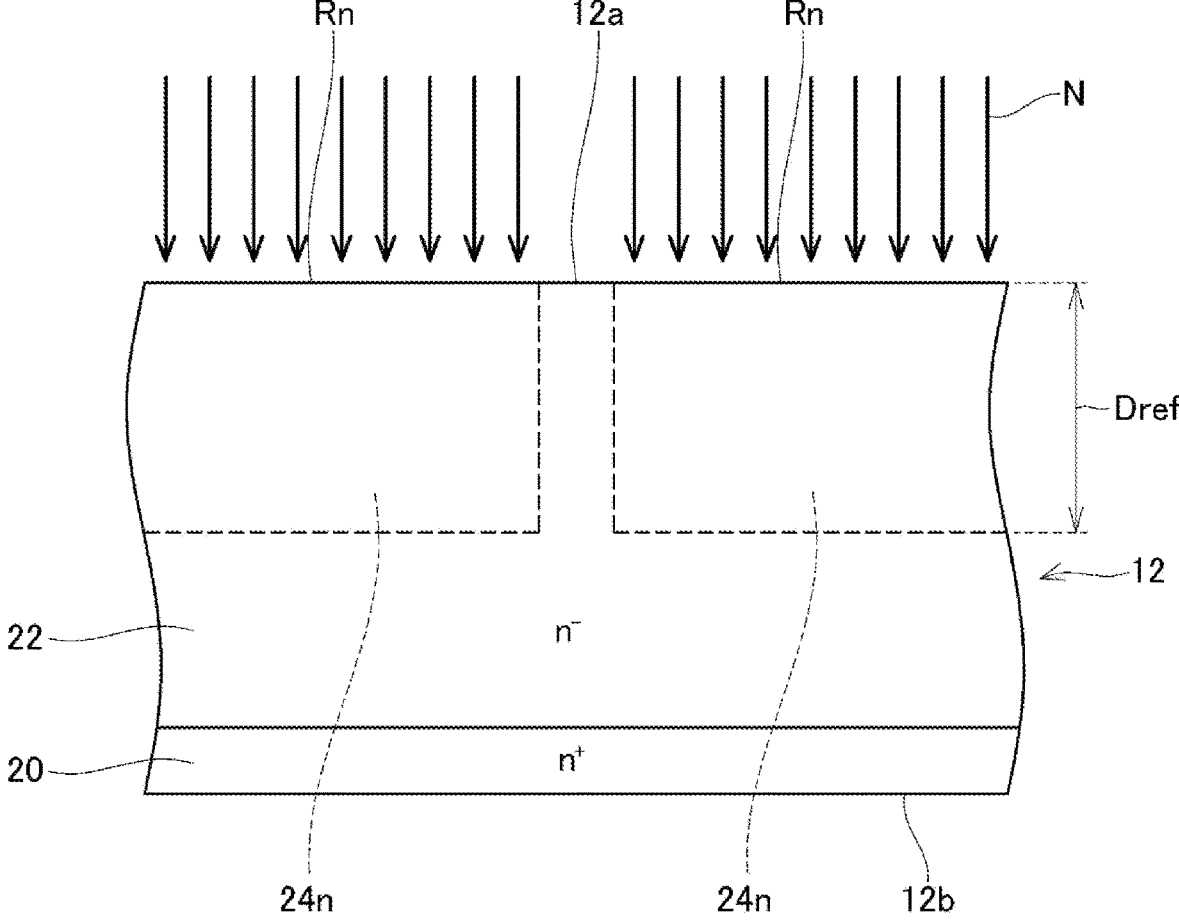
FIG. 3 is an explanatory view illustrating a step of implanting N.

In the manufacturing method of the first embodiment, as shown in FIG. 2, the drift layer 22 is epitaxially grown on the drain layer 20. Next, an N implantation step is performed. In the N implantation step, as shown in FIG. 3, N (nitrogen) ions are implanted into the upper surface 12a of the GaN-based semiconductor substrate 12. Here, a mask (not shown) is used to limit the implantation range of N. Hereinafter, the implantation range of N in the upper surface 12a is referred to as an implantation range Rn. Here, N ions are implanted into a region of the upper surface 12a where the body layer 24 is to be formed. Further, N ions are not implanted into a region of the upper surface 12a where the window portion 23 is to be formed. In the present embodiment, N ions are implanted plural times while changing the implantation energy En of N, thereby implanting N ions into the entire depth range corresponding to the body layer 24. By implanting N into the GaN-based semiconductor substrate 12 in this manner, the N implantation region 24n is formed in the GaN-based semiconductor substrate 12. When N is implanted into the GaN-based semiconductor substrate 12, crystal defects are formed in the implanted region. Therefore, the N implantation region 24n is a region in which crystal defects are formed by the N implantation step. In the GaN-based semiconductor substrate 12, the acceleration energy En (keV) at the time of implantation of N and the implantation depth Dn (nm) of N satisfy the following mathematical relationship under the condition that channeling is not performed (for example, the tilt angle is 7° and the twist angle is 15°).

$$Dn = -4.03 \times 10^{-4} En^2 + 1.41 En - 13.8$$

Note that the implantation depth Dn is an average depth at which N stops. N implanted into the GaN-based semiconductor substrate 12 with the implantation energy En is distributed around the implantation depth Dn.

Figure 4:
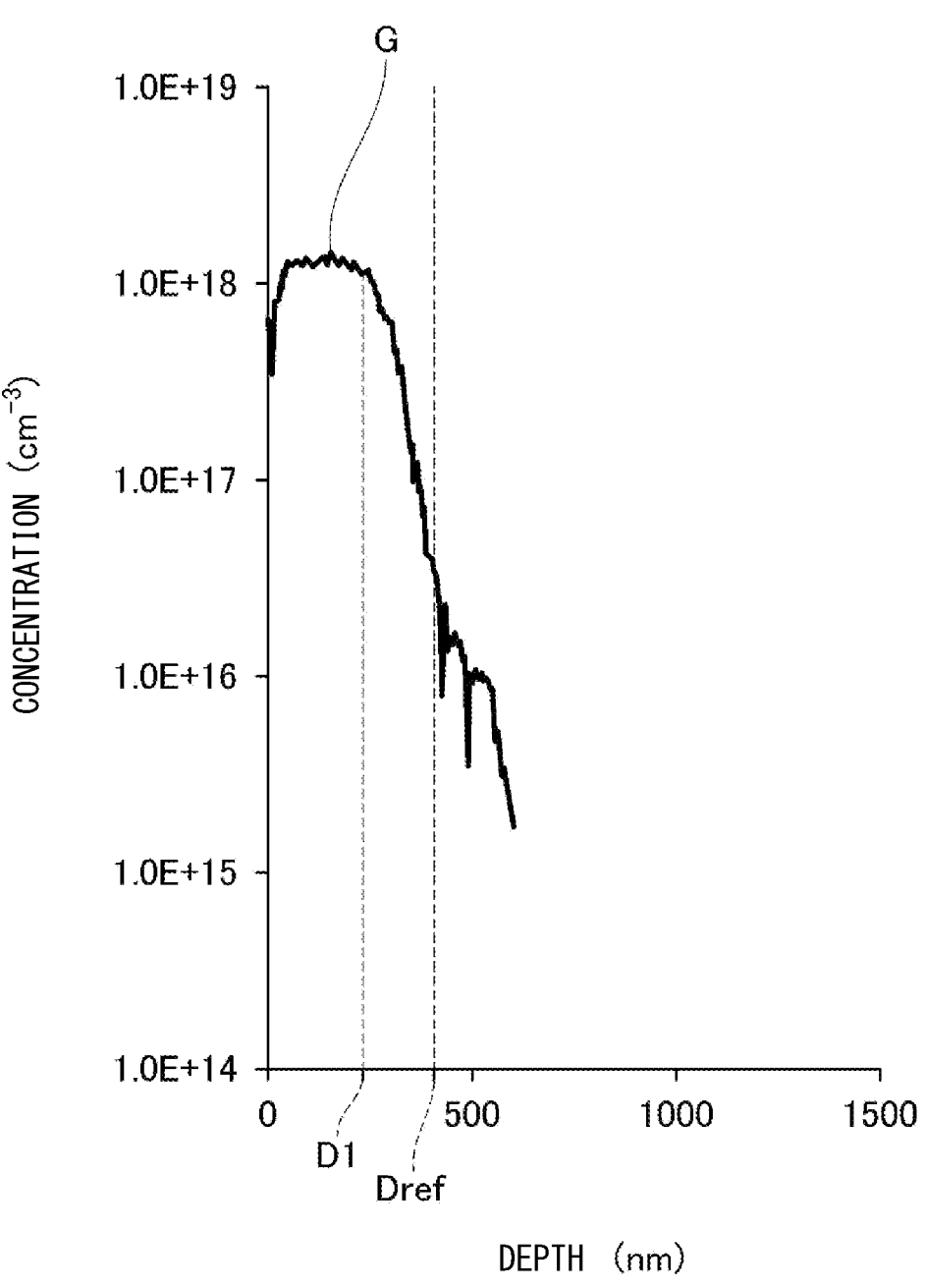
FIG. 4 is a graph showing a relationship between a concentration of N and a depth.

The graph G of FIG. 4 shows the concentration distribution of N implanted into the GaN-based semiconductor substrate 12 in the N implantation step. The horizontal axis of FIG. 4 indicates the implantation depth, and the origin indicates the position of the upper surface 12a. Since the GaN-based semiconductor substrate 12 itself has N, it is difficult to actually measure the concentration distribution of the implanted N. The graph G is calculated based on the implantation energy En in the N implantation step. As described above, when N is implanted into the GaN-based semiconductor substrate 12, crystal defects are formed in the GaN-based semiconductor substrate 12. The graph G corresponds to the distribution of crystal defects formed in the GaN-based semiconductor substrate in the N implantation step.

As described above, in the N implantation step, N ions are implanted plural times while changing the implantation energy En. Therefore, in the surface layer portion of the GaN-based semiconductor substrate 12, N is distributed at a relatively high concentration and a relatively uniform concentration. The depth D1 in FIG. 4 indicates the deepest implantation depth in the N implantation step. The reference depth Dref in FIG. 4 is calculated by the equation of Dref=D1+140 nm. As shown in FIG. 4, at the position of the reference depth Dref, the N concentration rapidly decreases toward the deeper side. That is, at the reference depth Dref, the density of crystal defects rapidly decreases toward the deeper side. In this way, it is possible to calculate the reference depth Dref at which the concentration of N rapidly decreases from the deepest injection depth D1 in the N implantation step. In FIG. 3, the position of the reference depth Dref is shown as the lower end of the N implantation region 24n.

Figure 5:
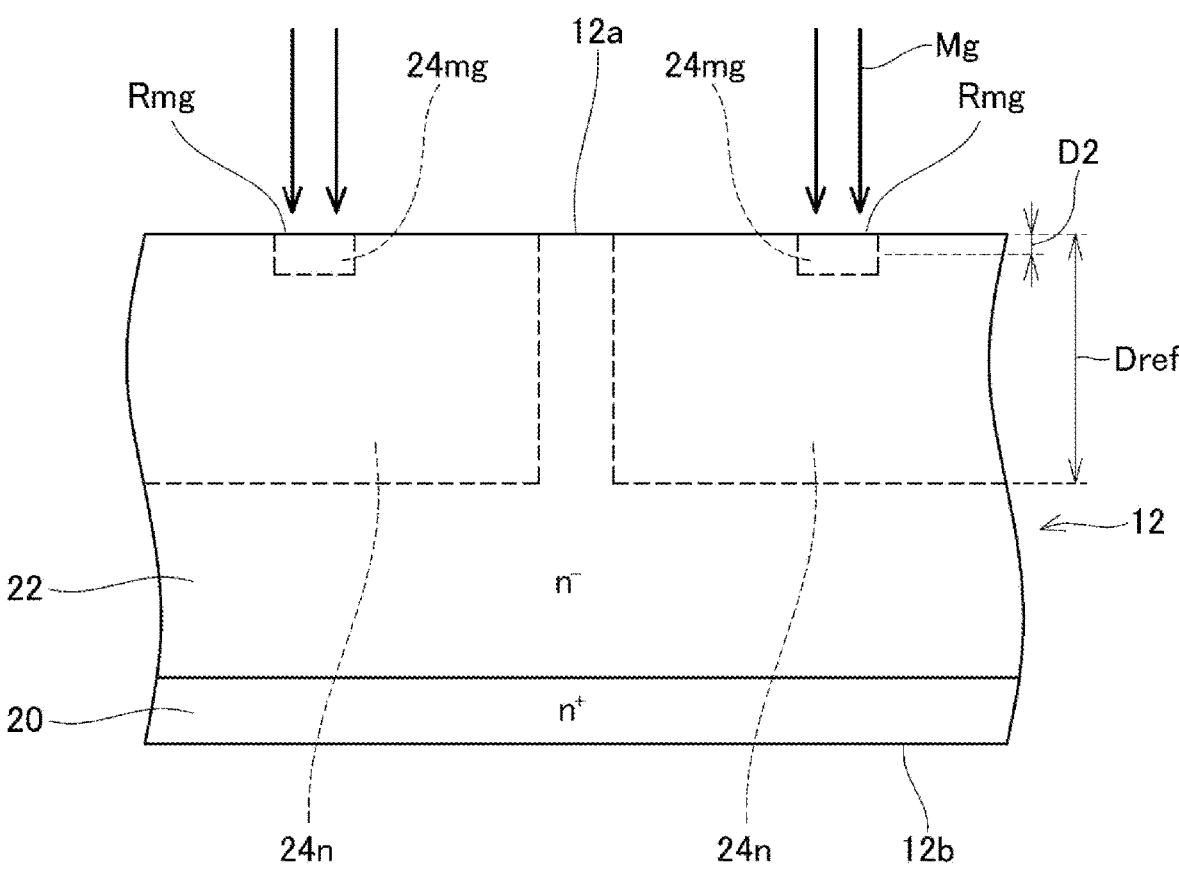
FIG. 5 is an explanatory view illustrating a step of implanting Mg according to a first embodiment.
Figure 6:
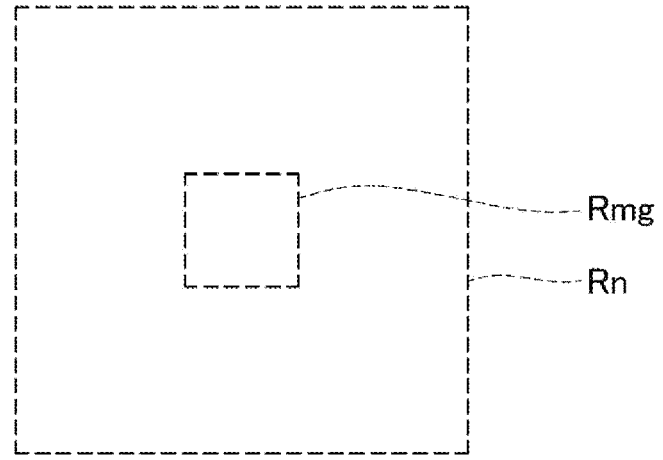
FIG. 6 is a plan view illustrating an Mg implantation range and an N implantation range when a GaN-based semiconductor substrate is viewed from the upper side.

Next, an Mg implantation step is performed. In the Mg implantation step, as shown in FIG. 5, Mg ions are implanted into the upper surface 12a of the GaN-based semiconductor substrate 12. The implantation range of Mg is limited using a mask (not shown). Hereinafter, the implantation range of Mg in the upper surface 12a is referred to as an implantation range Rmg. As shown in FIG. 6, Mg ions are implanted so that the implantation range Rn of N overlaps the implantation range Rmg of Mg on the upper surface 12a. In the present embodiment, the implantation range Rmg is smaller than the implantation range Rn, and the implantation range Rmg is included in the implantation range Rn. Mg ion implantation may be performed plural times while changing the implantation depth of Mg, or Mg ion implantation may be performed to a certain depth. By implanting Mg into the GaN-based semiconductor substrate 12 in this manner, an Mg implantation region 24mg is formed in the GaN-based semiconductor substrate 12. As shown in FIG. 5, Mg ions are implanted into a position shallower than the reference depth Dref. Hereinafter, the deepest implantation depth in the Mg implantation step is referred to as an implantation depth D2. As shown in FIG. 5, the implantation depth D2 is shallower than the reference depth Dref.

The amount of N implanted in the N implantation step may be equal to or greater than the amount of Mg implanted in the Mg implantation step. The implantation amount of N can be represented by a product of the dose amount DS1 in the N implantation step and the area S1 of the implantation range Rn in the N implantation step. The implantation amount of Mg can be represented by a product of the dose amount DS2 in the Mg implantation step and the area S2 of the implantation range Rmg in the Mg implantation step. That is, the implantation amounts of N and Mg can be adjusted so as to satisfy the relationship of $DS1 \cdot S1 > DS2 \cdot S2$.

After the N implantation step and the Mg implantation step are performed, a heat treatment step is performed. In the present embodiment, the GaN-based semiconductor substrate 12 is subjected to heat treatment at a temperature of 1300° C. or higher. When the GaN-based semiconductor substrate 12 is subjected to heat treatment, Mg diffuses and is activated inside the GaN-based semiconductor substrate 12. That is, Mg in the Mg implantation region 24mg diffuses to the periphery thereof. Mg is easily diffused in the N implantation region 24n. In addition, the diffusion of Mg is suppressed at the interface between the N implantation region 24n and the region in which N is not implanted.

Figure 7:
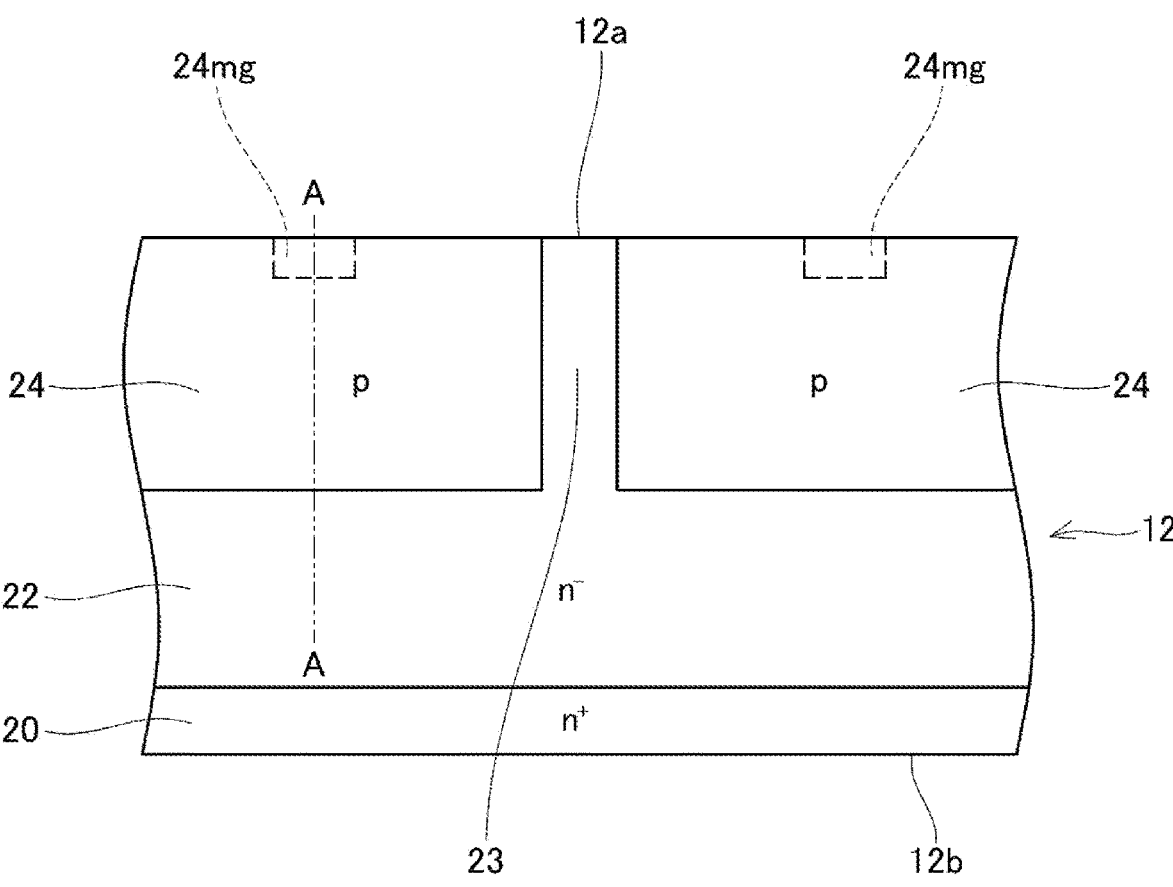
FIG. 7 is an explanatory view illustrating a heat treatment step of the first embodiment.

Therefore, as shown in FIG. 7, the p-type body layer 24 is formed in the N implantation region 24n.

Figure 8:
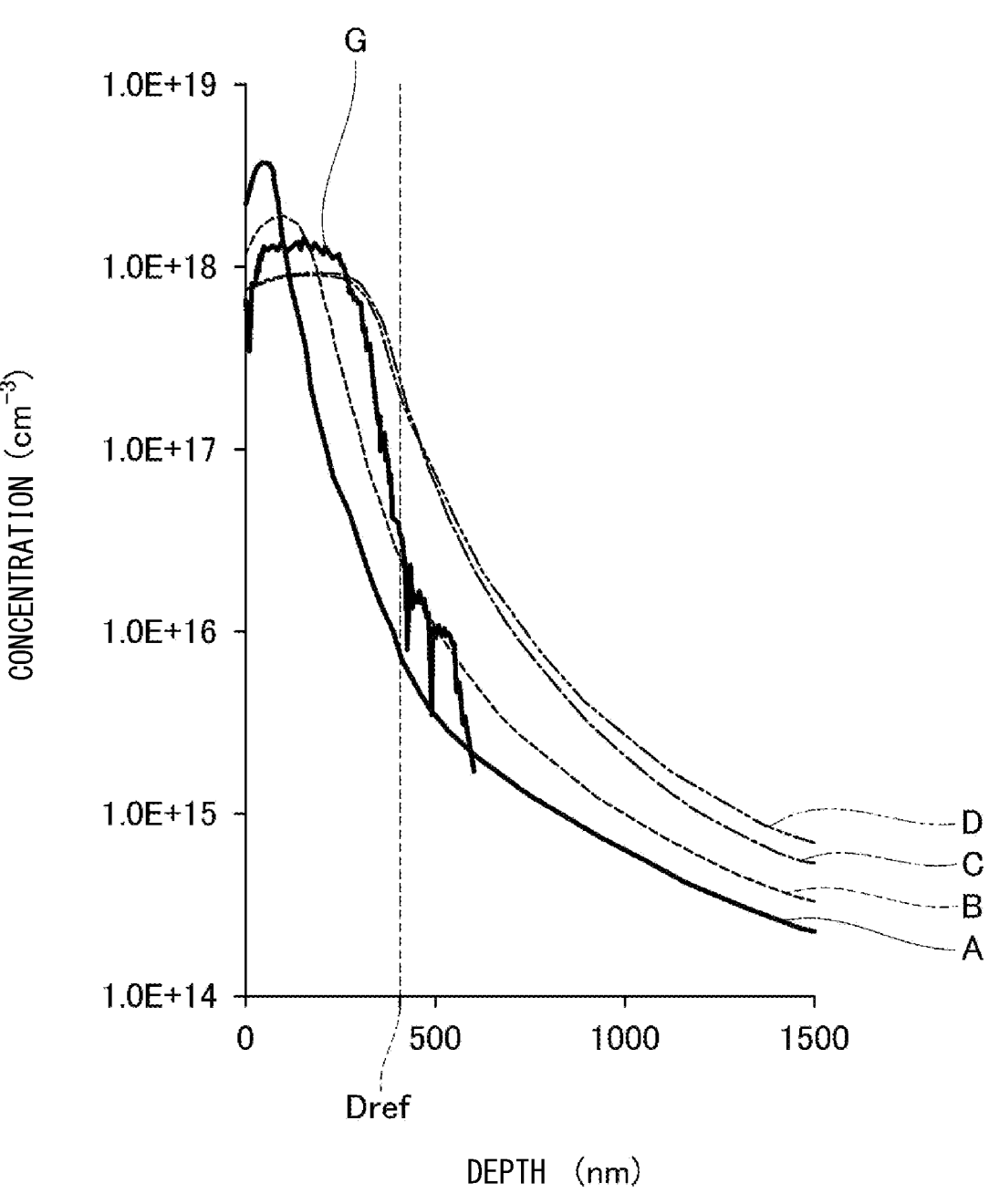
FIG. 8 is a graph showing a relationship between a concentration of Mg and a depth before the heat treatment step.
Figure 9:
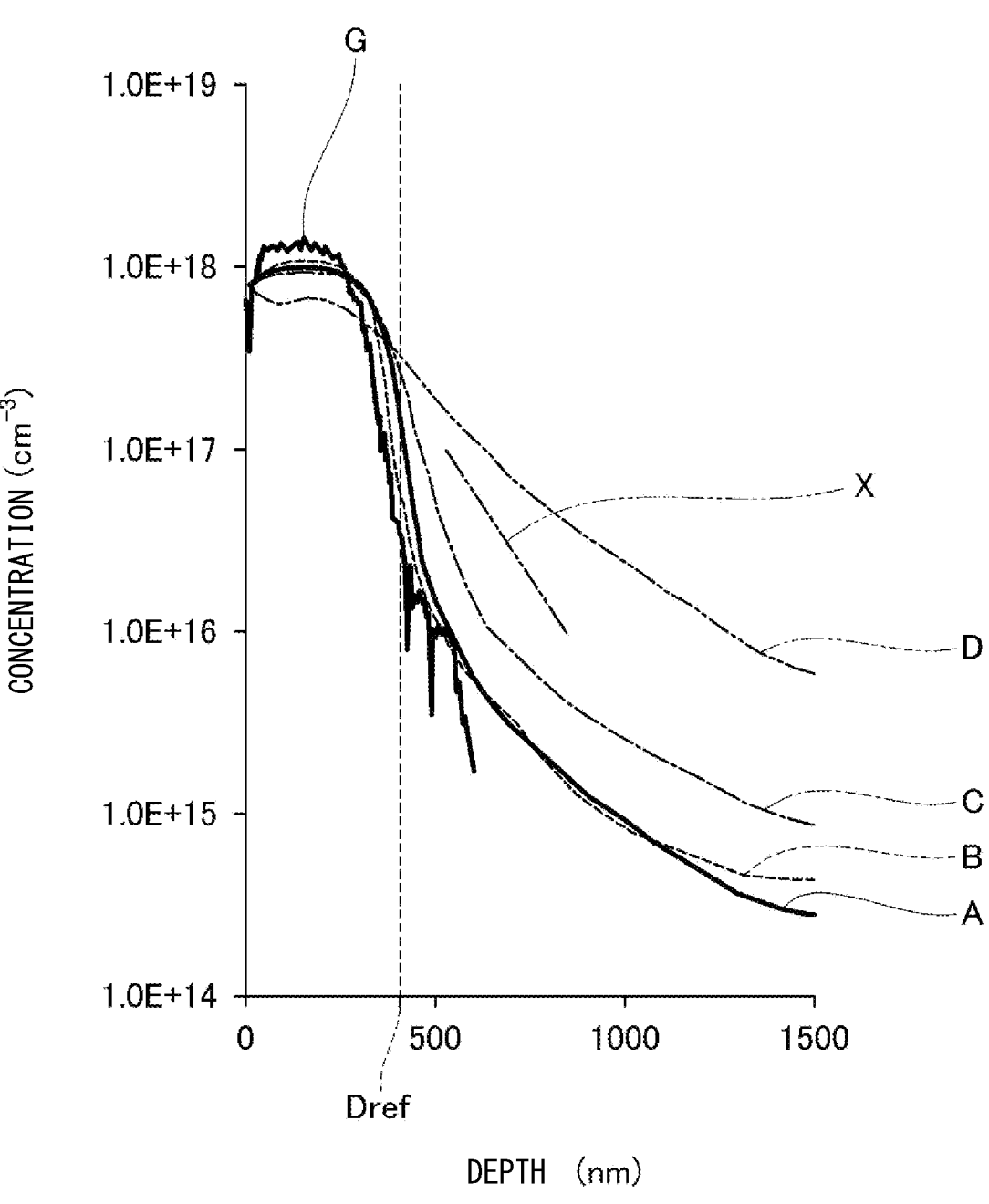
FIG. 9 is a graph showing a relationship between a concentration of Mg and a depth after the heat treatment step.

FIGS. 8 and 9 show the concentration distribution of Mg at the position of the straight line A-A in FIG. 7. That is, FIGS. 8 and 9 show the concentration distribution of Mg measured in the depth direction from the position where the N implantation range Rn and the Mg implantation range Rmg overlap. FIG. 8 shows the distribution before the heat treatment step, and FIG. 9 shows the distribution after the heat treatment step. Graphs A to C of FIGS. 8 and 9 show the concentration distribution of Mg according to the first embodiment. The graph G of FIGS. 8 and 9 shows the concentration distribution of N implanted in the N implantation step. That is, the graph G of FIGS. 8 and 9 is equal to the graph G of FIG. 4. The graph D of FIGS. 8 and 9 shows the concentration distribution of Mg when the N implantation step is not performed as a comparative example. Graphs A to D are plotted using values actually measured by experiments. As described above, the graph G is calculated based on the implantation energy En in the N implantation step.

As shown in FIG. 8, the graph A shows a case where Mg is injected at a high concentration into a narrow range of the surface layer portion in the Mg implantation step. The graph B shows a case where Mg is implanted in a wider range than the graph A at a concentration lower than that of the graph A in the Mg implantation step. The graph C shows a case where Mg is implanted in a wider range than the graph B at a lower concentration than the graph B in the Mg implantation step. As shown in FIG. 8, before the heat treatment step, the graph C and the graph D are substantially equal to each other.

As shown in FIG. 9, after the heat treatment step is performed, the Mg concentration is relatively uniformly distributed in the surface layer portion of the GaN-based semiconductor substrate 12 in any of the graphs A to C. The Mg concentration of the surface layer portion is substantially the same among the graphs A to C. This shows that Mg is sufficiently diffused in the N implantation region 24n. In the vicinity of the reference depth Dref, the Mg concentration rapidly decreases so that the Mg concentration decreases toward the deeper side. A broken line X in FIG. 9 represents a decrease rate at which the Mg concentration becomes 1/10 per depth of 300 nm (that is, the depth D and the Mg concentration P satisfy the formula of $dD/d\log_{10}P=300$ nm). In any of the graphs A to C, the Mg concentration decreases at the position of the reference depth Dref with an inclination steeper than that of the broken line X. That is, in any of the graphs A to C, at the position of the reference depth Dref, the Mg concentration decreases at a decrease rate smaller than a decrease rate at which the Mg concentration becomes 1/10 per depth of 300 nm (that is, $dD/d\log_{10}P<300$ nm). In the graph D, the Mg concentration in the surface layer portion is lower than those in the graphs A to C. Further, in the graph D, the gradient of the decrease in the Mg concentration at the position corresponding to the reference depth Dref is gentler than the broken line X. That is, in the graph D, the decrease rate $dD/d\log_{10}P$ is larger than 300 nm. Therefore, in a range deeper than the reference depth Dref, the Mg concentration is higher in the graph D than in the graphs A to C. That is, in the graph D, Mg diffuses to a position deeper than the graphs A to C. As is clear from the comparison between the graphs A to C and the graph D, when the N implantation step is performed, the diffusion of Mg is suppressed at the position of the reference depth Dref (that is, the position of the boundary relative to the N implantation region 24n). As described above, when the heat treatment step is performed after the N implantation step and the Mg implantation step, it is possible to suppress the diffusion of Mg into a region deeper than the reference depth Dref in the vicinity of the reference depth Dref.

As described above, when the heat treatment step is performed after the N implantation step and the Mg implantation step, the diffusion of Mg is suppressed at the interface between the N implantation region 24n and the region in which N is not implanted. Therefore, the diffusion range of Mg can be controlled by controlling the implantation range Rn and the implantation depth Dn in the N implantation step, and the formation range of the body layer 24 can be accurately controlled.

Figure 10:
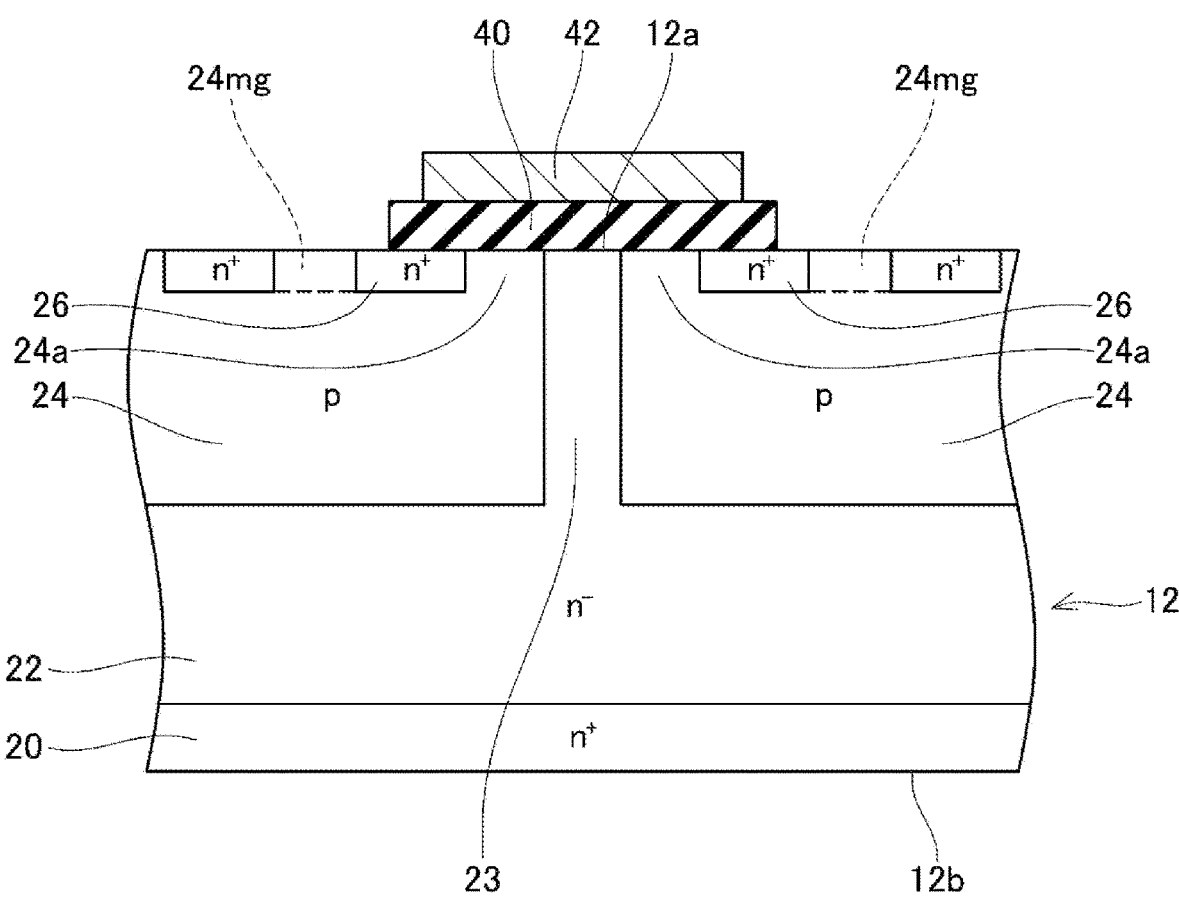
FIG. 10 is an explanatory view illustrating a step of forming a gate insulating film and a gate electrode.

Next, as shown in FIG. 10, the source layer 26 is formed by ion implantation. Next, the gate insulating film 40 is formed so as to cover the surface of the body layer 24 between the source layer 26 and the window portion 23. Next, the gate electrode 42 is formed on the gate insulating film 40. By forming the gate insulating film 40 and the gate electrode 42 in this manner, the surface layer portion of the body layer 24 between the source layer 26 and the window portion 23 becomes the channel region 24a. In FIG. 10, the body layer 24 outside the Mg implantation region 24mg is formed of Mg diffused from the Mg implantation region 24mg. The Mg implanted region 24mg contains many crystal defects formed when Mg ions are implanted. On the other hand, the number of crystal defects present in the body layer 24 outside the Mg implanted region 24mg is less than that in the Mg implanted region 24mg. When the body layer 24 outside the Mg implantation region 24mg is used as the channel region 24a, crystal defects in the channel region 24a can be reduced. The channel resistance can be reduced by reducing crystal defects in the channel region 24a. Here, a portion having a concentration of 10% or more of the Mg concentration in the Mg implantation region 24mg can be set as the channel region 24a. Thereby, suitable switching can be realized.

Thereafter, the interlayer insulating film 44, the source electrode 46, and the drain electrode 48 are formed, whereby the semiconductor device 10 illustrated in FIG. 1 is completed.

As described above, according to the manufacturing method of the first embodiment, the diffusion distance of Mg can be accurately controlled, and the formation range of the body layer 24 can be accurately controlled. Therefore, it is possible to reduce variation in the length of the window portion 23 in the vertical direction, and it is possible to reduce variation in the on-resistance of the semiconductor device 10. In addition, since it is possible to restrict Mg from diffusing to the interface between the drift layer 22 and the drain layer 20, it is possible to suppress variation in on-resistance due to the influence of the segregation layer. In addition, since the diffusion distance of Mg can be accurately controlled, the Mg concentration in the channel region 24a can be accurately controlled. As a result, variation in the gate threshold of the semiconductor device 10 can be suppressed.

Figure 11:
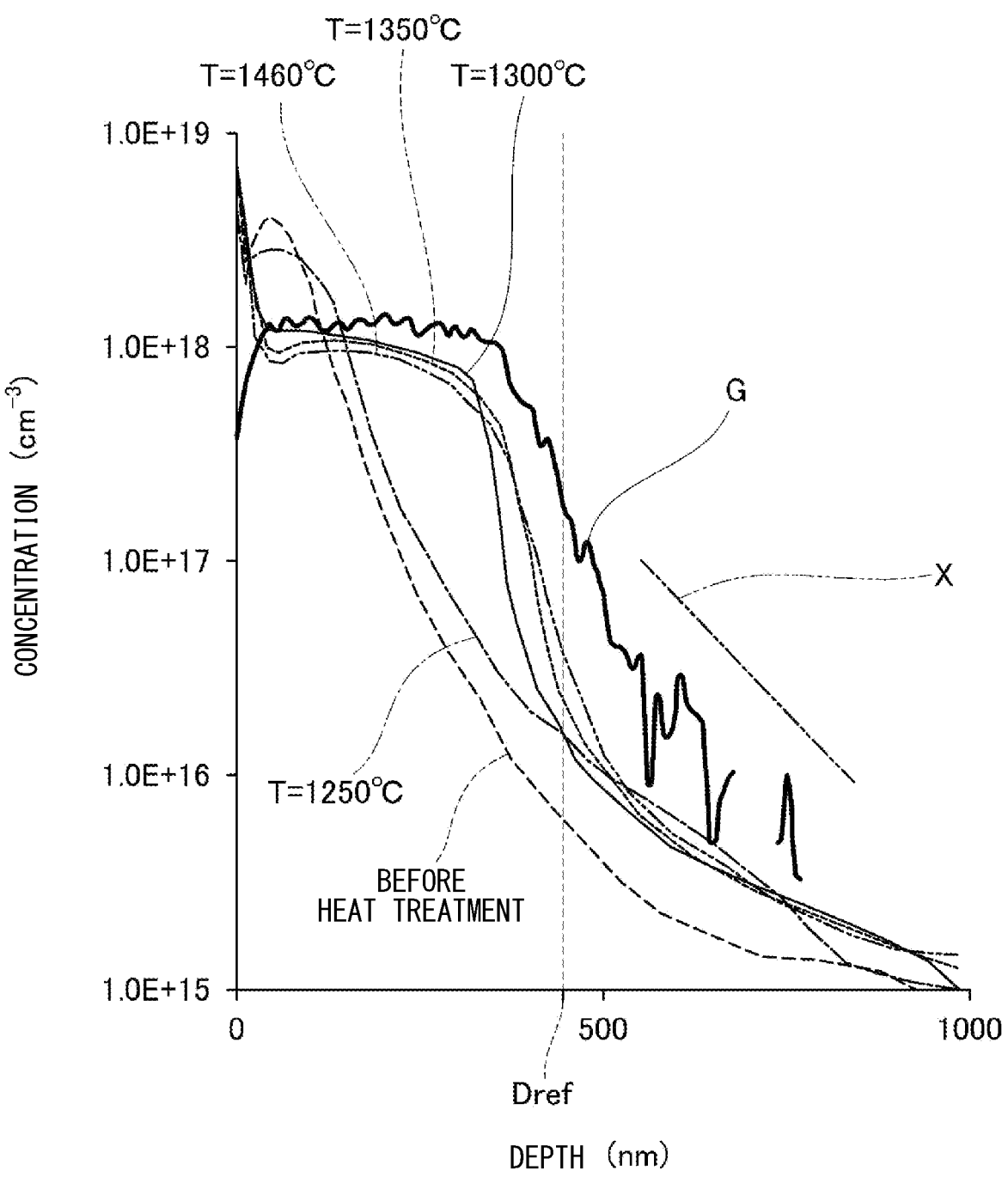
FIG. 11 is a graph showing a relationship between a concentration of Mg and a depth when a temperature of a heat treatment is changed.

When the heat treatment step is performed after the N implantation step and the Mg implantation step, if the temperature or time in the heat treatment step is insufficient, the diffusion distance of Mg may not be accurately controlled. For example, when the heat treatment step is insufficient, Mg does not sufficiently diffuse to the position of the reference depth Dref, and the effect of suppressing the diffusion of Mg at the interface of the N implantation region 24n cannot be obtained. For example, FIG. 11 shows the concentration distribution when the heat treatment step is performed while changing the heat treatment temperature after the N implantation step and the Mg implantation step. As shown in FIG. 11, when the heat treatment temperature T is 1300° C., 1350° C., or 1460° C., Mg can be sufficiently diffused to the reference depth Dref. That is, in these cases, the Mg concentration decreases at the position of the reference depth Dref with a steeper slope than the broken line X. On the other hand, when the heat treatment temperature T is 1250° C., Mg cannot be sufficiently diffused to the reference depth Dref. Therefore, in this case, the gradient of the Mg concentration at the reference depth Dref is gentler than the broken line X. That is, in this case, the effect of suppressing the diffusion of Mg at the interface of the N implantation region 24n cannot be obtained. Therefore, in order to obtain the effect of suppressing the diffusion of Mg at the interface of the N implantation region 24n, the GaN-based semiconductor substrate 12 is subjected to heat treatment at a temperature of 1300° C. or higher and lower than the melting point in the heat treatment step.

Second Embodiment

Figure 12:
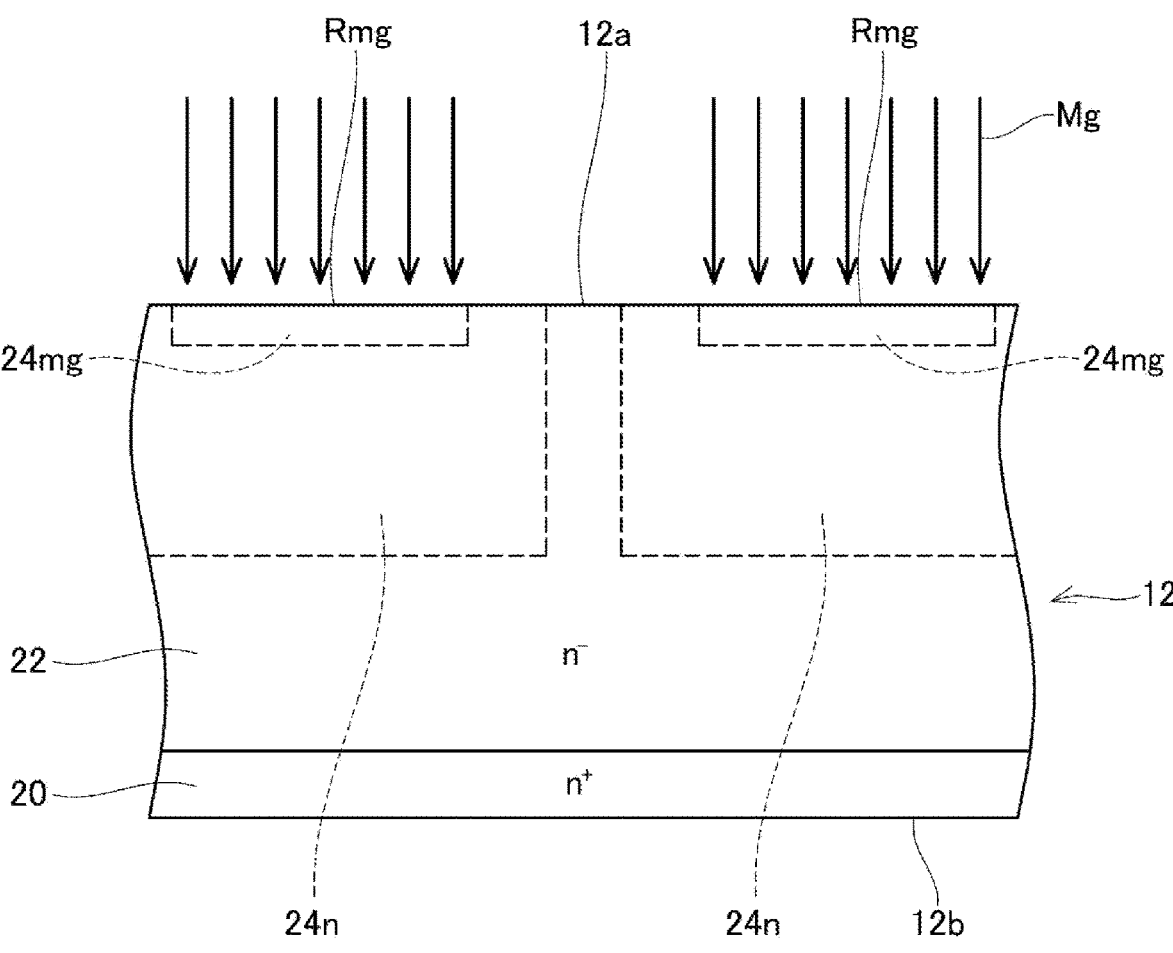
FIG. 12 is an explanatory view illustrating a step of implanting Mg according to a second embodiment.
Figure 13:
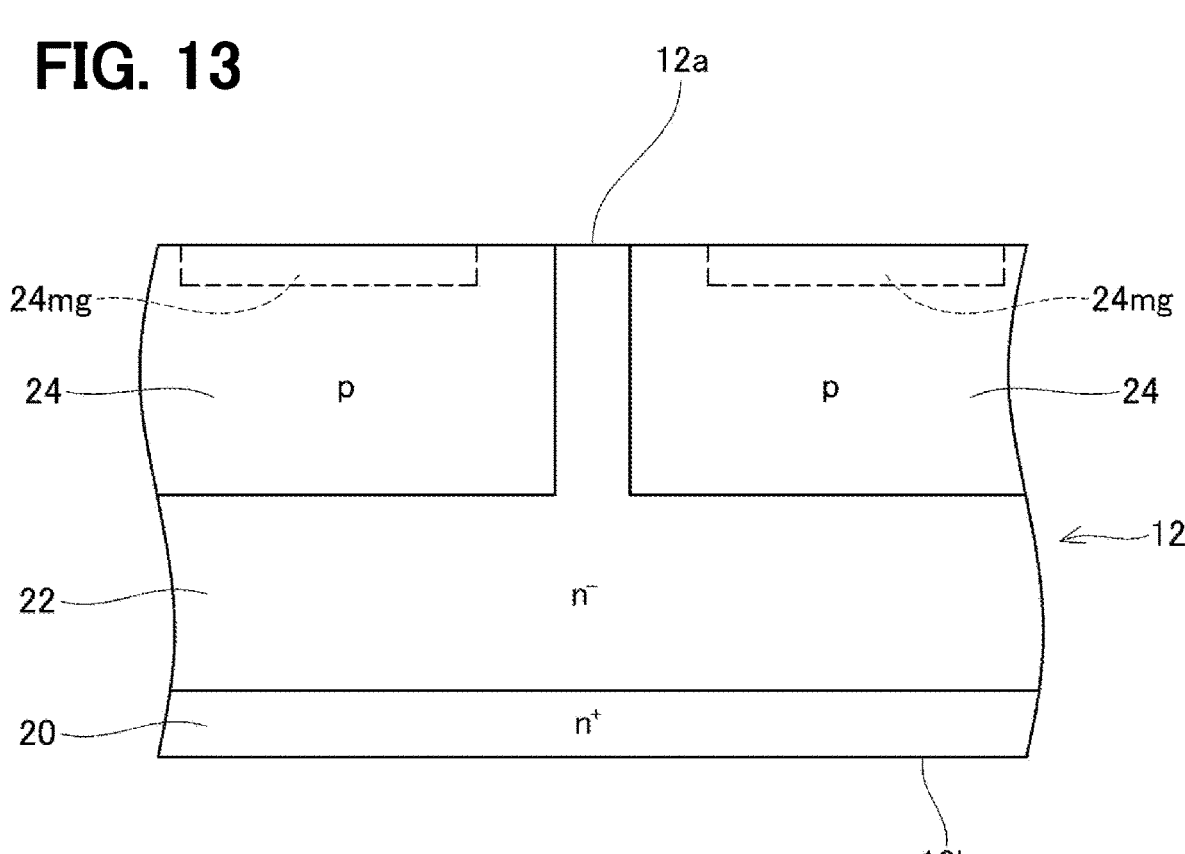
FIG. 13 is an explanatory view illustrating a heat treatment step of the second embodiment.
Figure 14:
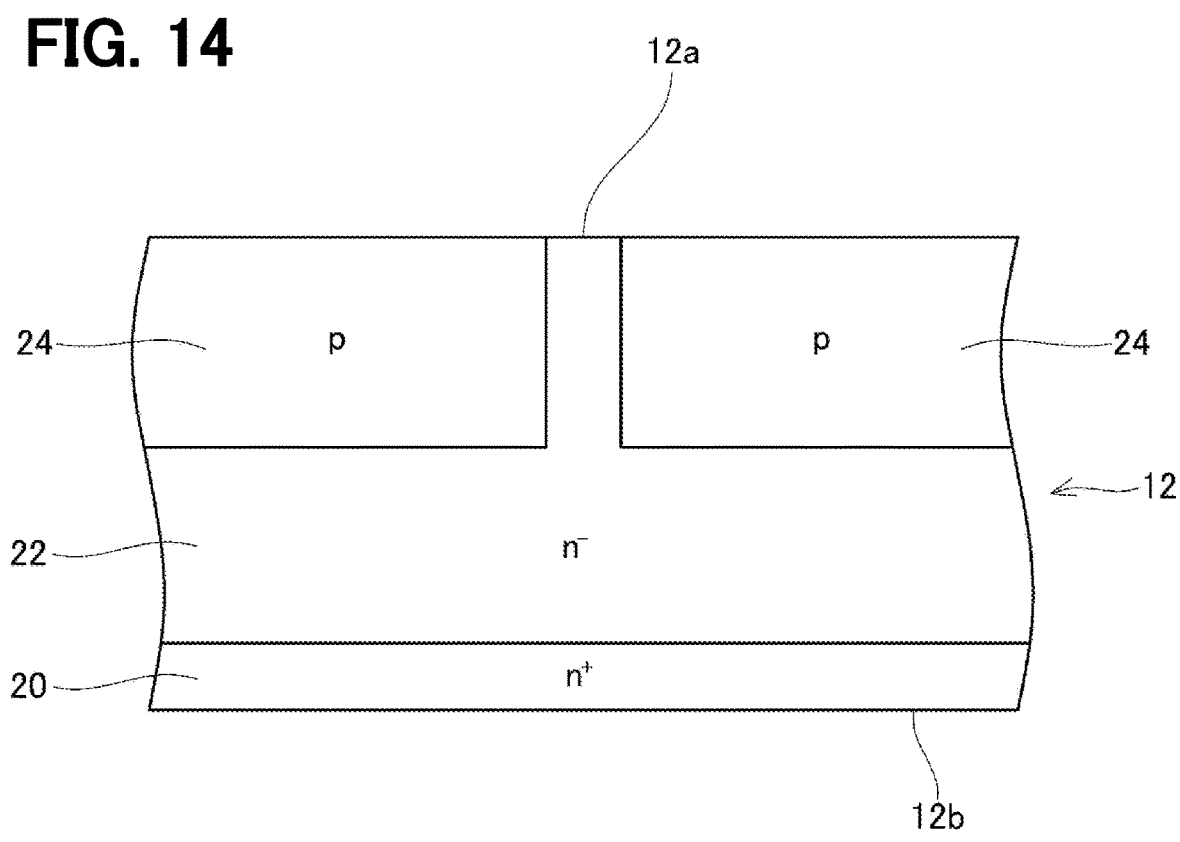
FIG. 14 is an explanatory view illustrating a step of removing an Mg implantation range of the second embodiment.

In the manufacturing method of the second embodiment, after the N implantation step is performed in the same manner as in the manufacturing method of the first embodiment, the Mg implantation step is performed. As shown in FIG. 12, Mg is implanted in a range wider than that of the first embodiment (see FIG. 5) but within the implantation range of N. Next, a heat treatment step is performed in the same manner as in the first embodiment, and the body layer 24 is formed in the N implantation region 24n, as shown in FIG. 13. Next, by etching the upper surface 12a of the GaN-based semiconductor substrate 12, as shown in FIG. 14, the Mg implantation region 24mg is removed, and the body layer 24 under the Mg implantation region 24mg is exposed. Next, the source layer 26, the gate insulating film 40, the gate electrode 42, the interlayer insulating film 44, the source electrode 46, and the drain electrode 48 are formed in the same manner as in the first embodiment. Thus, the semiconductor device 10 is completed.

In the manufacturing method of the second embodiment, the gate insulating film 40 and the gate electrode 42 are formed so that the body layer 24 exposed by the removal of the Mg implantation region 24mg becomes the channel region 24a. According to the manufacturing method of the second embodiment, the body layer 24 outside the Mg implantation region 24mg can be used as the channel region 24a, and crystal defects in the channel region 24a can be reduced. Therefore, the channel resistance can be reduced.

In the first and second embodiments, N is implanted as an inert element into the GaN-based semiconductor substrate 12. However, at least one of N, Ga, Ar, H, and He may be implanted as the inert element. Instead of the inert element, an electron beam may be injected (irradiated) into the GaN-based semiconductor substrate 12.

In the first and second embodiments, the Mg implantation step is performed after the implantation step of the inert element. The implantation step of inert element may be performed after the Mg implantation step.

In the first and second embodiments, the Mg implantation range Rmg is included in the implantation range of the inert element. However, while the Mg implantation range Rmg and the implantation range of the inert element at least partially overlap, the Mg implantation range Rmg may be distributed to the outside of the implantation range of the inert element. Even in such a configuration, the diffusion distance of Mg can be controlled in the implantation region of the inert element.

The implantation range Rn is an example of the first implantation range, and the implantation range Rmg is an example of the second implantation range.

Although the embodiments have been described in detail above, these are merely examples and do not limit the scope of claims. The techniques described in claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A method of manufacturing a semiconductor device comprising:
    injecting an inert element or electron beam into a GaN-based semiconductor substrate;
    implanting magnesium into the GaN-based semiconductor substrate; and
    performing a heat treatment on the GaN-based semiconductor substrate after the injecting and the implanting, wherein
    a first implantation range, which is an injection range of inert element or electron beam, and a second implantation range, which is an implantation range of magnesium, overlap with each other on a surface of the GaN-based semiconductor substrate,
    a reference depth Dref (nm) calculated using a formula of Dref=D1+140 and a deepest injection depth D1 (nm) in the injecting is deeper than a deepest implantation depth D2 (nm) in the implanting,
    after the heat treatment, a concentration of magnesium decreases toward a deeper side at a predetermined decrease rate at a position of the reference depth Dref in a distribution of magnesium concentration in a depth direction within a range where the first implantation range and the second implantation range overlap with each other,
    the predetermined decrease rate is smaller than a decrease rate at which a concentration of magnesium becomes 1/10 per depth of 300 nm,
    the second implantation range is included in the first implantation range on the surface, and
    a dose amount DS1 in the injecting, an area S1 of the first implantation range, a dose amount DS2 in the implanting, and an area S2 of the second implantation range satisfy a relationship of DS1·S1>DS2·S2.

2. The method according to claim 1, wherein
    the injecting includes implanting at least one of N, Ga, Ar, H, and He into the GaN-based semiconductor substrate.

3. The method according to claim 1, wherein
    a heat treatment temperature is higher than or equal to 1300° C. in the heat treatment.

4. The method according to claim 1, further comprising
    forming a gate electrode, after the heat treatment, such that a region of the surface outside the second implantation range and inside the first implantation range becomes a channel region.

5. The method according to claim 1, further comprising
    removing a region where magnesium is implanted in the implanting after the heat treatment so as to expose a p-type region below the region; and
    forming a gate electrode so that the p-type region becomes a channel region.

6. A method of manufacturing a semiconductor device comprising:
    injecting an inert element or electron beam into a GaN-based semiconductor substrate;
    implanting magnesium into the GaN-based semiconductor substrate; and
    performing a heat treatment on the GaN-based semiconductor substrate after the injecting and the implanting, wherein
    a first implantation range, which is an injection range of inert element or electron beam, and a second implantation range, which is an implantation range of magnesium, overlap with each other on a surface of the GaN-based semiconductor substrate,
    a reference depth Dref (nm) calculated using a formula of Dref=D1+140 and a deepest injection depth D1 (nm) in the injecting is deeper than a deepest implantation depth D2 (nm) in the implanting,
    after the heat treatment, a concentration of magnesium decreases toward a deeper side at a predetermined decrease rate at a position of the reference depth Dref in a distribution of magnesium concentration in a depth direction within a range where the first implantation range and the second implantation range overlap with each other,
    the predetermined decrease rate is smaller than a decrease rate at which a concentration of magnesium becomes 1/10 per depth of 300 nm,
    the method of manufacturing the semiconductor device further comprises forming a gate electrode, after the heat treatment, such that a region of the surface outside the second implantation range and inside the first implantation range becomes a channel region, and
    a concentration of magnesium in the channel region is 10% or more of a concentration of magnesium in a region where magnesium is implanted in the implanting.

7. The method according to claim 6, wherein
    the injecting includes implanting at least one of N, Ga, Ar, H, and He into the GaN-based semiconductor substrate.

8. The method according to claim 6, wherein
    a heat treatment temperature is higher than or equal to 1300° C. in the heat treatment.

* * * * *